(12) United States Patent
Kim

(10) Patent No.: US 8,737,147 B2
(45) Date of Patent: May 27, 2014

(54) NONVOLATILE MEMORY APPARATUS

(75) Inventor: Min Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,272

(22) Filed: Sep. 3, 2012

(65) Prior Publication Data

US 2013/0322146 A1  Dec. 5, 2013

(30) Foreign Application Priority Data

Jun. 5, 2012 (KR) ........................ 10-2012-0060371

(51) Int. Cl.
G11C 7/00 (2006.01)
G11C 11/412 (2006.01)
G11C 15/04 (2006.01)
G11C 15/00 (2006.01)

(52) U.S. Cl.
CPC .......... G11C 11/4125 (2013.01); G11C 15/046 (2013.01); *G11C 15/00* (2013.01)
USPC ............................ 365/200; 365/51; 365/49.17

(58) Field of Classification Search
CPC ... G11C 11/4125; G11C 15/00; G11C 15/046
USPC ........................................ 365/200, 49.17, 51
See application file for complete search history.

(56) References Cited

U.S. PATENT DOCUMENTS

| 7,430,693 | B2 * | 9/2008 | Noguchi et al. | ............... 714/710 |
| 7,660,160 | B2 * | 2/2010 | Kim et al. | ................... 365/185.2 |
| 7,733,697 | B2 * | 6/2010 | Picca et al. | ............... 365/185.09 |
| 7,898,866 | B2 * | 3/2011 | Yoon | .......................... 365/185.2 |
| 8,004,898 | B2 * | 8/2011 | Park et al. | ................. 365/185.12 |
| 8,040,725 | B2 * | 10/2011 | Kang | ........................ 365/185.03 |
| 2006/0018159 | A1 * | 1/2006 | Picca et al. | ............... 365/185.17 |
| 2012/0008397 | A1 * | 1/2012 | Shin et al. | ................. 365/185.11 |
| 2012/0106247 | A1 * | 5/2012 | Shin | ........................ 365/185.03 |
| 2013/0077399 | A1 * | 3/2013 | Kang | .......................... 365/185.2 |
| 2013/0135928 | A1 * | 5/2013 | Lee | ........................... 365/185.03 |

FOREIGN PATENT DOCUMENTS

| KR | 1020100070026 A | 6/2010 |
| KR | 1020100115123 A | 10/2010 |

* cited by examiner

*Primary Examiner* — Viet Q Nguyen
(74) *Attorney, Agent, or Firm* — William Park & Associates Patent Ltd.

(57) ABSTRACT

A nonvolatile memory apparatus includes a memory cell area including memory cells for storing data input from an external apparatus, a redundancy cell area including memory cells configured to substitute failed memory cells, and a flag cell area including memory cells for storing whether most significant bits of the memory cells have been programmed. The flag cell area is configured in a part of the redundancy cell area.

10 Claims, 4 Drawing Sheets

NONVOLATILE MEMORY APPARATUS

CROSS-REFERENCES TO RELATED APPLICATION

The present application claims priority under 35 U.S.C. §119(a) to Korean application number 10-2012-0060371, filed on Jun. 5, 2012, in the Korean Intellectual Property Office, which is incorporated herein by reference in its entirety as set forth in full.

BACKGROUND

1. Technical Field

The present invention relates to a semiconductor memory apparatus, and more particularly, to a nonvolatile memory apparatus including a flag cell in a redundancy memory cell area.

2. Related Art

In general, a semiconductor memory apparatus is classified into a volatile memory apparatus and a nonvolatile memory apparatus. In the volatile memory apparatus, stored data is lost when power is off. However, in the nonvolatile memory apparatus, stored data is retained although power is off. The nonvolatile memory apparatus includes various types of memory cell transistors. The nonvolatile memory apparatus may be classified into a flash memory apparatus, a ferroelectric RAM (FRAM), a magnetic RAM (MRAM), a phase change RAM (PRAM) and the like according to the structure of the memory cell transistor.

Of the nonvolatile memory apparatus, the flash memory apparatus is mainly classified into a NOR flash memory apparatus and a NAND flash memory apparatus according to a connection state of a memory cell and a bit line. The NOR flash memory apparatus has a structure in which two or more memory cell transistors are connected to one bit line in a parallel manner. Thus, the NOR flash memory apparatus has superior random access time characteristics. The NAND flash memory apparatus, however, has a structure in which two or more memory cell transistors are connected to one bit line in a serial manner. Such a structure is called a cell string, and one bit line contact is required per one cell string. Thus, the NAND flash memory apparatus has superior characteristics in terms of the degree of integration.

In the nonvolatile memory apparatus, defects may occur due to various factors in a fabrication process. When defects occur in is a peripheral circuit for driving a memory cell array of the nonvolatile memory apparatus, the nonvolatile memory apparatus may not normally operate. However, when defects occur in a part of memory cells of the memory cell array, it is possible to replace a failed memory cell with a redundancy memory cell. To this end, the nonvolatile memory apparatus include redundancy memory cells.

SUMMARY

A nonvolatile memory apparatus including a flag cell in a redundancy memory cell area is described herein.

In one embodiment of the present invention, a nonvolatile memory apparatus includes: a memory cell area including memory cells for storing data input from an external apparatus; a redundancy cell area including memory cells configured to substitute failed memory cells; and a flag cell area including memory cells for storing an indication of whether most significant bits of the memory cells have been programmed, wherein the flag cell area is configured in a part of the redundancy cell area.

In one embodiment of the present invention, the nonvolatile memory apparatus further includes a content addressed memory unit configured to substantially manage the redundancy cell area and the flag cell area.

In one embodiment of the present invention, the content addressed memory unit includes: a flag CAM latch block configured to store address information on the flag cell area; a repair CAM latch is block configured to store address information on the redundancy cell area; and a CAM control logic configured to selectively control the flag CAM latch block and the repair CAM latch block in response to a flag activation signal and a repair activation signal.

According to the present invention, it is possible to improve the yield of the nonvolatile memory apparatus.

BRIEF DESCRIPTION OF THE DRAWINGS

Features, aspects, and embodiments are described in conjunction with the attached drawings, in which.

DETAILED DESCRIPTION

Figure 1:
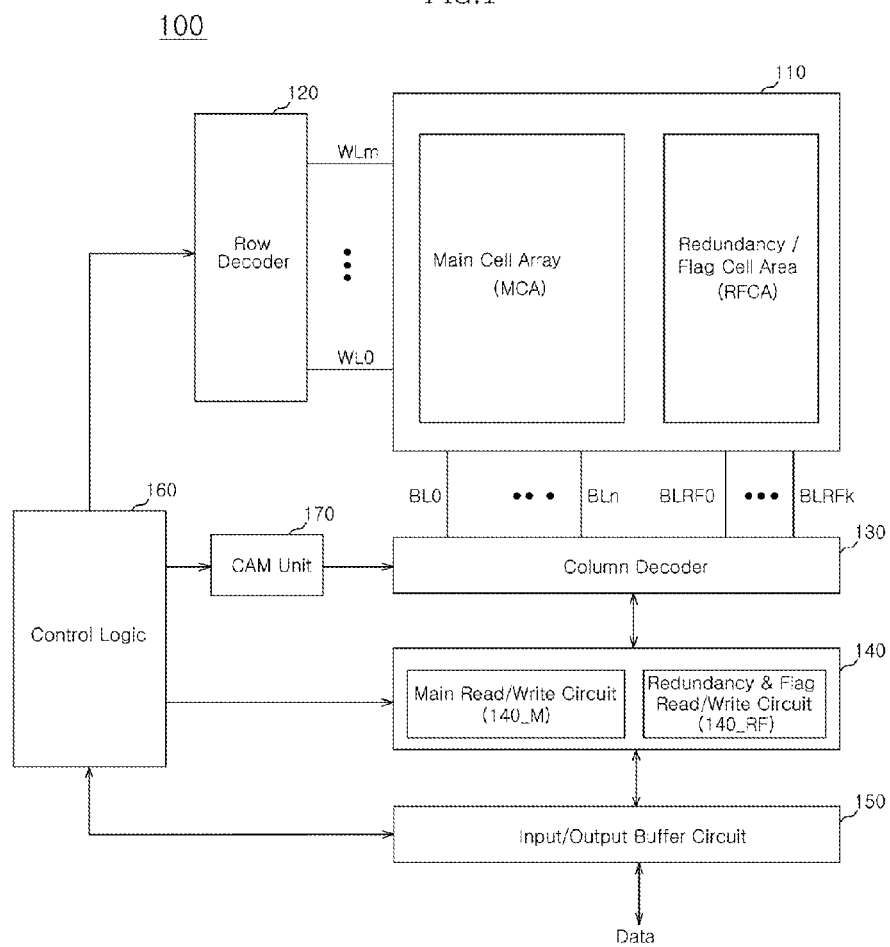
FIG. 1 is a block diagram illustrating a nonvolatile memory apparatus according to an embodiment.

Hereinafter, a nonvolatile memory apparatus according to the present invention will be described in detail with reference to the accompanying drawings through example embodiments. However, the present invention is not limited to the embodiments described herein, but may be embodied in other forms. The embodiments are provided to describe the present invention such that the concept of the present invention may be understood by those skilled in the art.

In the drawings, the embodiments of the present invention are not limited to illustrated specific forms, but are exaggerated for clarity. In this specification, specific terms are used to describe the present invention, but do not limit the scope of the present invention.

In this specification, terms such as and/or include any item among combinations of a plurality of related items or the plurality of related items. Furthermore, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. The terminology used herein is for the purpose of describing particular embodiments only and is not intended to be limiting of the invention. As used herein, the singular forms are intended to include the plural forms as well, unless the context clearly indicates otherwise. It will be further understood that the terms "comprise", "comprising", "have" and/or "having", when used herein, specify the presence of stated features, integers, steps, operations, elements, and/or components, but do not preclude the presence or addition of one or more other features, integers, steps, operations, elements, components, and/or groups thereof.

FIG. 1 is a block diagram illustrating a nonvolatile memory apparatus according to an embodiment. Referring to FIG. 1, a nonvolatile memory apparatus 100 includes a memory cell array 110, a row decoder 120, a column decoder 130, a data read/write circuit 140, an input/output buffer circuit 150, a control logic 160, and a content addressed memory (CAM) unit 170.

The memory cell array 110 includes a main cell area (MCA) and a redundancy/flag cell area (RFCA). The main cell area (MCA) includes memory cells for storing data provided from an external apparatus (not illustrated). Each memory cell included in the main cell area (MCA) may store 2-bit data or 2-bit or more data. Such a memory cell is called a multi-level cell (MLC). The multi-level cell (MLC) is programmed to have a threshold voltage corresponding to one of an erase state and a plurality of program states.

The redundancy/flag cell area (RFCA) includes redundancy memory cells configured to substitute for failed memory cells among the memory cells included in the main cell area (MCA). The redundancy memory cells may include at least one flag cell. The flag cell represents a memory cell for storing whether most significant bits (MSBs) of the memory cells included in the main cell area (MCA) have been programmed. The flag cell will be described later.

The row decoder 120 is connected to the memory cell array 110 through word lines WL0 to WLm. The row decoder 120 is configured to decode an input address. The row decoder 120 is configured to transfer various word line voltages to the word lines WL0 to WLm according to results of the decoding. For example, the row decoder 120 may provide a selection voltage to a selected word line and provide a non-selection voltage to a non-selected word line.

The column decoder 130 is connected to the memory cell array 110 through bit lines BL0 to BLn and BLRF0 to BLRFk. The column decoder 130 is configured to decode an input address. The column decoder 130 is configured to selectively connect the bit lines BL0 to BLn and BLRF0 to BLRFk to the data read/write circuit 140 according to results of decoding that the column decoder 130 may perform.

The data read/write circuit 140 operates under control of the control logic 160. The data read/write circuit 140 operates as a write driver or a sense amplifier according to which operation is being performed. For example, in a program operation, the data read/write circuit 140 programs data, which is input from an external apparatus through the input/output buffer circuit 150, in the main cell area (MCA). In another example, in a read operation, the data read/write circuit 140 reads data programmed in the main cell area (MCA).

The data read/write circuit 140 includes a main read/write circuit 140_M which operates a write driver or a sense amplifier for the main cell area (MCA). Furthermore, the data read/write circuit 140 includes a redundancy/flag read/write circuit 140_RF which operates a write driver or a sense amplifier for the redundancy/flag cell area (RFCA). The main read/write circuit 140_M and the redundancy/flag read/write circuit 140_RF have substantially the is same structure to perform substantially the same operation.

The input/output buffer circuit 150 is configured to receive data from an external apparatus (for example, a memory controller, a memory interface, a host apparatus and the like), and output data to the external apparatus. To this end, the input/output buffer circuit 150 may include a data latch circuit and an output driving circuit.

The control logic 160 is configured to control the overall operation of the nonvolatile memory apparatus 100 in response to a command provided from the external apparatus (for example, the memory controller, the memory interface, the host apparatus and the like). For example, the control logic 160 may control a read operation, a write (or a program) operation, and an erase operation of the nonvolatile memory apparatus 100.

In addition, the control logic 160 is configured to control an operation for setting a part of the redundancy/flag cell area (RFCA) as a flag cell. Furthermore, the control logic 160 is configured to control an operation for setting a part of the redundancy/flag cell area (RFCA) as a redundancy cell. To this end, the control logic 160 may control the CAM unit 170.

The CAM unit 170 operates under control of the control logic 160. The CAM unit 170 is configured to substantially manage an address of a memory cell to be used as a flag cell in the redundancy/flag cell area (RFCA). The CAM unit 170 may perform addressing such that a set flag cell is activated when access to the flag cell is generated. The CAM unit 170 is configured to substantially manage an address of a memory cell to be used as a redundancy cell configured to substitute for a failed memory cell in the redundancy/flag cell area (RFCA). The CAM unit 170 may perform addressing such that a corresponding redundancy cell is activated when access to the failed memory cell is generated. The CAM unit 170 will be described in reference to FIG. 4.

Figure 2:
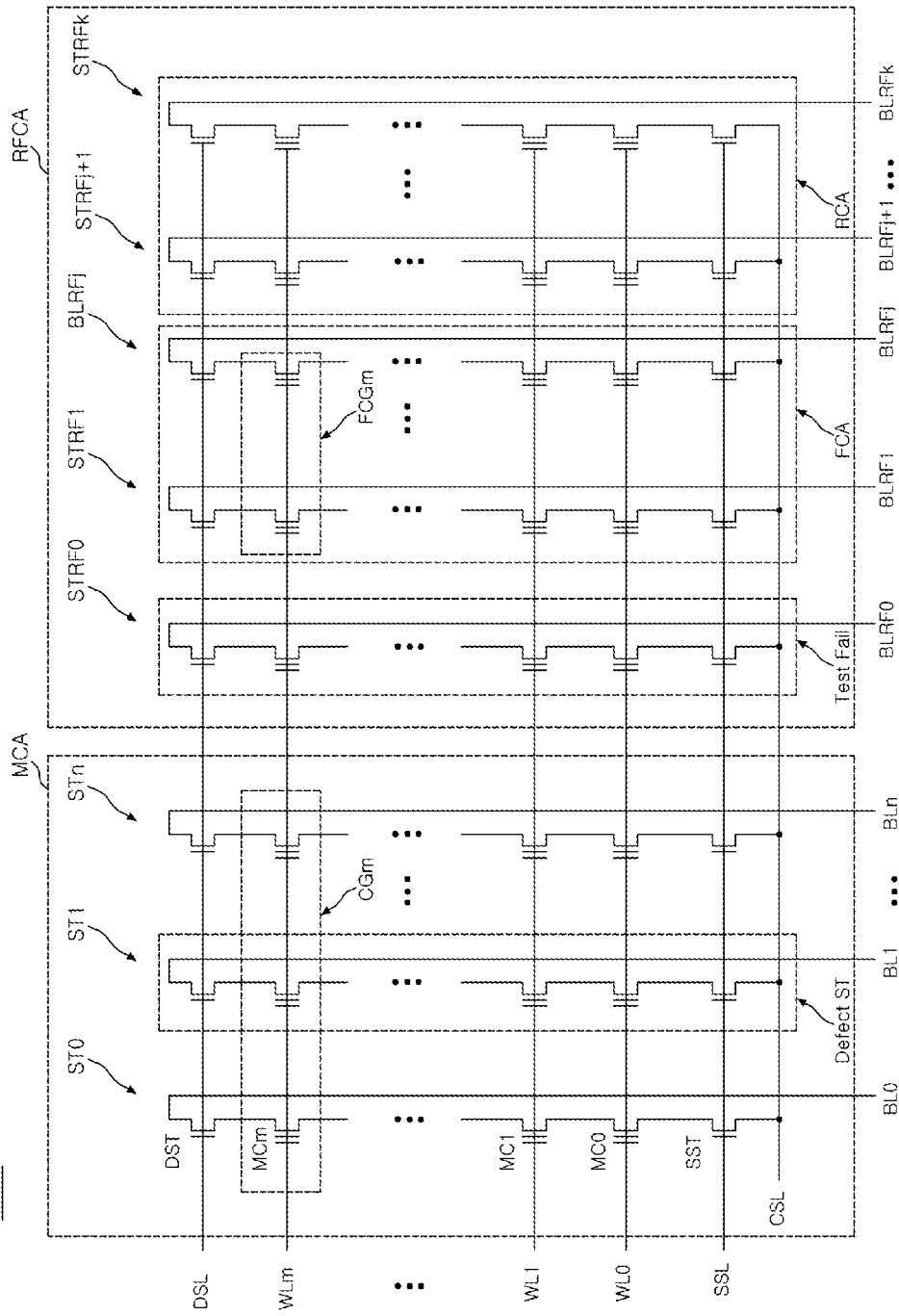
FIG. 2 is a circuit diagram illustrating a memory block of a nonvolatile memory apparatus according to an embodiment.
Figure 3:
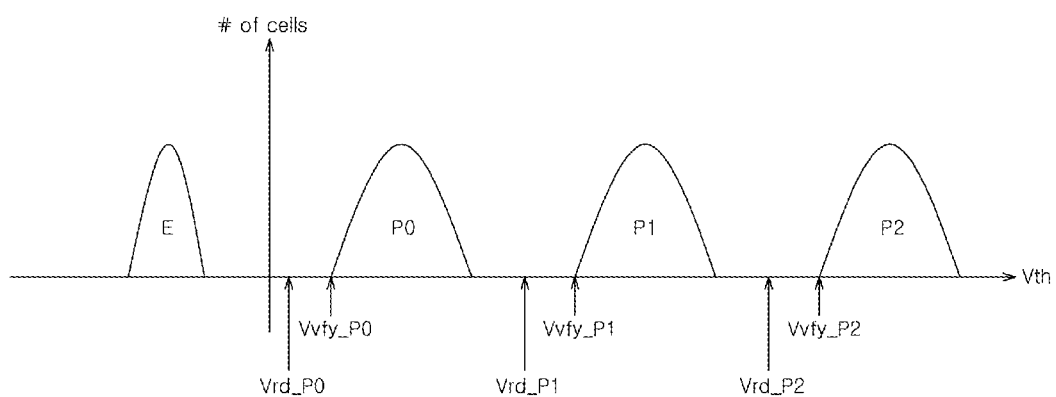
FIG. 3 is a diagram illustrating threshold voltage distributions of memory cells of a nonvolatile memory apparatus according to an embodiment.

FIG. 2 is a circuit diagram illustrating a memory block of the nonvolatile memory apparatus according to an embodiment. FIG. 3 is a diagram illustrating threshold voltage distributions of the memory cells of the nonvolatile memory apparatus according to the embodiment. For brevity of description, FIG. 2 illustrates only one memory block included in the main cell area (MCA) of FIG. 1 and the redundancy/flag cell area (RFCA) corresponding to the main cell area (MCA).

For ease of description, it is assumed that a defect has occurred in a cell string ST1 of the main cell area (MCA) and a cell string STRF0 of the redundancy/flag cell area (RFCA). Furthermore, it is assumed that stings STRF1 to STRFj of the redundancy/flag cell area (RFCA) have been set as a flag cell area (FCA) in a test process. Furthermore, it is assumed that stings STRFj+1 to STRFk of the redundancy/flag cell area (RFCA) have been set as a redundancy cell area (RCA) in the test process.

The main cell area (MCA) is an area for storing data provided from the outside of the nonvolatile memory apparatus. Although not illustrated in the drawing, the main cell area (MCA) may is include a main area and a spare area. The main area stores use data provided from outside the nonvolatile memory apparatus. The spare area stores data related to user data stored in the main area, for example, metadata such as an error correction code.

The main cell area (MCA) includes a plurality of cell strings ST0 to STn connected to a plurality of bit lines BL0 to BLn. Since the cell strings ST0 to STn have substantially the same circuit configuration, one cell string ST0 will be representatively described for brevity of description.

The cell string ST0 includes a plurality of memory cells MC0 to MCn and select transistors DST and SST connected between the bit line BL0 and a common source line (CSL). For example, the cell string ST0 includes the drain select transistor (DST) connected to a drain select line (DSL), the plurality of memory cells MC0 to MCn connected to the plurality of word lines WL0 to WLm, and the source select transistor (SST) connected to a source select line (SSL).

The redundancy/flag cell area (RFCA) includes the flag cell area (FCA) and the redundancy cell area (RCA). The redundancy/flag cell area (RFCA) includes cell strings normally operating after the test is performed. For example, the redundancy/flag cell area (RFCA) may include the remaining cell stings STRF1 to STRFk except for the failed cell string STRF0.

Since the flag cell area (FCA) has substantially the same structure as that of the main cell area (MCA), detailed description thereof will be omitted. One of the memory cells of the main cell area (MCA) corresponding to the flag cell area (FCA) is used as a storage area for storing an indication of whether the most significant bit (MSB) has been programmed. Thus, the flag cell area (FCA) is a hidden area not accessible by a user, differently from the main cell area (MCA) for storing user data. For conciseness of description, a main cell group (CGm) of the main cell area (MCA) and a flag cell group (FCGm) corresponding to the main cell group (CGm) will be described in detail as an example.

Each memory cell of the main cell group (CGm) may store a plurality of data bits (for example, 2-bit data or 2-bit or more data). Such a memory cell is called a multi-level cell (MLC). For example, as illustrated in FIG. 3, the multi-level cell (MLC) may be programmed to have a threshold voltage corresponding to one of an erase state E and a plurality of program states P0, P1, and P2 according to stored multi-bit data. When the multi-level cell stores 2-bit data as illustrated in FIG. 3, the most significant bit (MSB) and the least significant bit (LSB) are programmed. When the MSB is programmed, since a corresponding flag cell is programmed, a read operation is simplified with reference to the programmed flag cell.

For example, when one of the memory cells of the main cell group (CGm) is MSB-programmed, all the flag cells of the corresponding flag cell group (FCGm) are programmed. At this time, the flag cells of the flag cell group (FCGm) store at least 1-bit data, respectively. That is, each flag cell of the flag cell group (FCGm) is a single level cell (SLC). Thus, it is possible to determine whether the memory cells of the corresponding main cell group (CGm) have been MSB-programmed according to the data stored in the flag cells of the flag cell group (FCGm).

The data stored in the flag cells of the flag cell group (FCGm) may be changed for some reason. Therefore, the flag cells of the flag cell group (FCGm) are read through an error checking method. As such an error checking method, a majority checking method may be used. For example, through the majority checking method, a majority of data of the data stored in the flag cells of the flag cell group (FCGm) may be determined as data stored in the flag cells. For this reason, the flag cell group (FCGm) may include a plurality of flag cells.

If defects occur in a separate memory area operating as a flag cell, the nonvolatile memory apparatus (100 of FIG. 1) may not operate normally. According to an embodiment, the flag cell area (FCA) is configured by a part of cell strings normally operating after the test is performed, that is, cell strings included in the memory area (RFCA) provided for repair. That is, the flag cell area (FCA) is configured by a part of the memory area (RFCA) provided for repair, instead of a separate memory area operating as a flag cell. Consequently, the probability that defects occur in the flag cell area (FCA) is reduced.

The redundancy cell area (RCA) includes remaining areas, not including the area (FCA), set after the flag cell in the redundancy/flag cell area (RFCA) is set. The cell stings STRFj+1 to STRFk of the redundancy cell area (RCA) may substitute for the string ST1 of the main cell area where defects have occurred.

Figure 4:
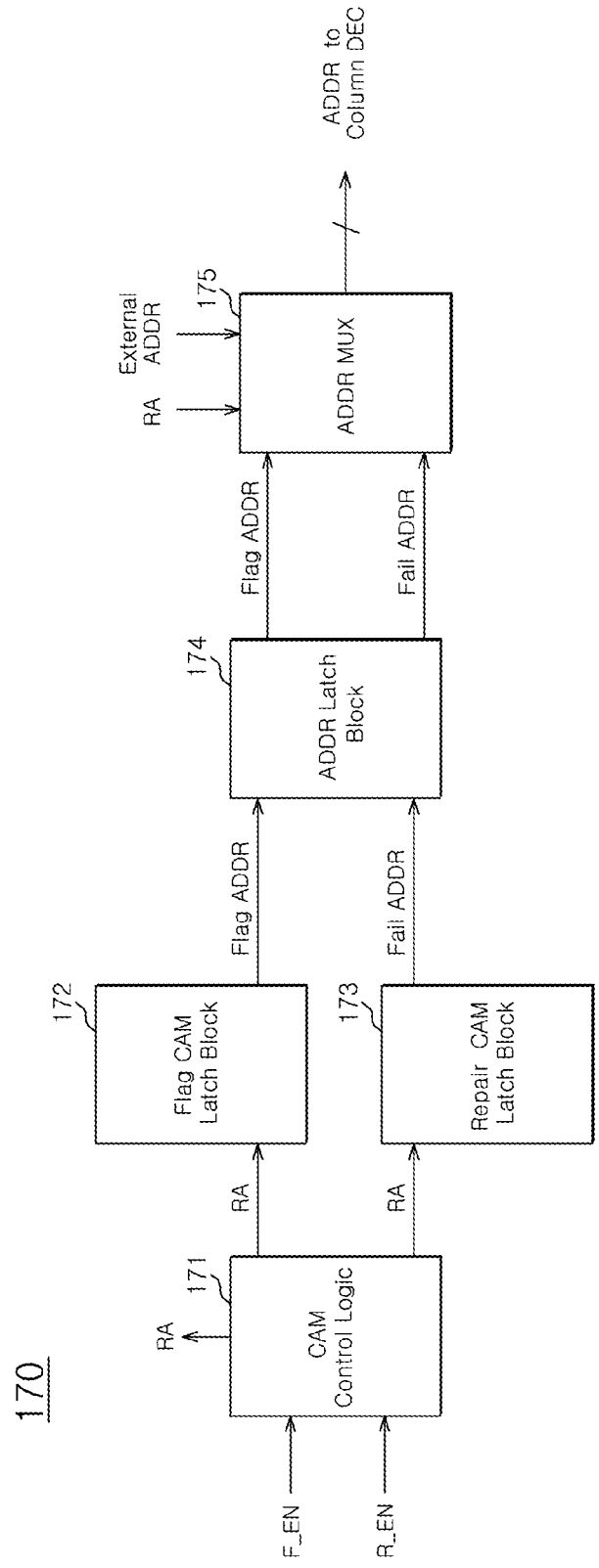
FIG. 4 is a block diagram illustrating a CAM unit illustrated in FIG. 1.

FIG. 4 is a block diagram illustrating the CAM unit illustrated in FIG. 1. With reference to FIG. 2 and FIG. 4, the configuration and operation of the CAM unit will be described in detail.

The CAM unit 170 is configured to switch addresses such that the flag cell area (FCA) and the redundancy cell area (RCA) illustrated in FIG. 2 can be accessed according to necessity. The CAM unit 170 includes a CAM control logic 171, a flag CAM latch block 172, a repair CAM latch block 173, an address latch block 174, and an address MUX 175.

Since the CAM unit 170 includes the flag CAM latch block 172 and the repair CAM latch block 173, it is possible to selectively perform an operation for switching addresses such that the flag cell area (FCA) can be accessed, and an operation for switching addresses such that the redundancy cell area (RCA) can be accessed. Operation of the CAM unit 170 may be selected according to control signals F_EN and R_EN provided from the control logic 160 (see FIG. 1).

The CAM control logic 171 is configured to switch addresses such that the flag cell area (FCA) can be accessed, in response to a flag activation signal F_EN. The CAM control logic 171 provides a redundancy address (RA) to the flag CAM latch block 172 in response to the flag activation signal F_EN. The redundancy address (RA) is used to select the flag cell area (FCA) from the redundancy/flag cell area (RFCA). For example, the redundancy address (RA) may be is obtained by indexing addresses of the redundancy/flag cell area (RFCA).

The flag CAM latch block 172 is configured to store and substantially manage the redundancy address (RA) and a physical address of the flag cell area (FCA) corresponding to the redundancy address (RA). In response to the provided redundancy address (RA), the flag CAM latch block 172 provides physical addresses of the stings STRF1 to STRFj to the address latch block 174, the physical addresses of the stings STRF1 to STRFj may be set as the flag cell area (FCA), for example, bit line addresses BLRF1 to BLRFj. That is, the flag CAM latch block 172 is configured to provide addresses for designating the range of the flag cell area (FCA) to the address latch block 174 in response to selective control of the CAM control logic 171.

The address latch block 174 is configured to buffer the provided physical addresses of the flag cell area (FCA). Through the buffering operation of the address latch block 174, the operation of the CAM unit 170 can be stabilized.

The address MUX 175 is configured to operate in response to the redundancy address (RA) provided from the CAM control logic 171. The address MUX 175 is configured to provide the column decoder (130 of FIG. 1) with the physical addresses of the flag cell area (FCA) provided from the address latch block 174.

With the configuration of the CAM unit 170, although a part of the memory area (RFCA) provided for repair is allocated as the flag cell area (FCA), access to the flag cell area (FCA) is possible.

The CAM control logic 171 switches addresses such that the redundancy cell area (RCA) can be accessed, in response to the repair activation signal R_EN. The CAM control logic 171 provides the redundancy address (RA) to the repair CAM latch block 173 in response to the repair activation signal R_EN. The redundancy address (RA) is used to select the redundancy cell area (RCA) from the redundancy/flag cell area (RFCA). For example, the redundancy address (RA) may be obtained by indexing the addresses of the redundancy/flag cell area (RFCA).

The repair CAM latch block 173 is configured to store and substantially manage the redundancy address (RA) and a defective or failed address of the main cell area (MCA) corresponding to the redundancy address (RA). The repair CAM latch block 173 provides the address latch block 174 with the failed address of the main cell area (MCA), for example, the bit line address BL1, in response to the provided redundancy address (RA). That is, the repair CAM latch block 173 is configured to provide the address latch block 174 with an address, which is to be replaced due to a defect in the main cell area (MCA), in response to control of the CAM control logic 171.

The address latch block 174 is configured to buffer the provided failed address. Through the buffering operation of the address latch block 174, operation of the CAM unit 170 can be stabilized.

The address MUX 175 is configured to operate based on the redundancy address (RA) provided from the CAM control logic 171, an external address provided from an external apparatus in order to access the main cell area (MCA), and the provided failed address. The address MUX 175 is configured to provide the column decoder 130 with a physical address of the redundancy cell area (RCA) which substitutes for the failed address.

With the CAM unit 170 configured in the manner described, it is possible to access the redundancy cell area (RCA) which substitutes for the main cell area (MCA) where defects have occurred.

While certain embodiments have been described above, it will be understood to those skilled in the art that the embodiments described are by way of example only. Accordingly, the nonvolatile memory apparatus described herein should not be limited based on the described embodiments. Rather, the nonvolatile memory apparatus described herein should only be limited in light of the claims that follow when taken in conjunction with the above description and accompanying drawings.

What is claimed is:

1. A nonvolatile memory apparatus comprising:
   a memory cell area including memory cells for storing data input from an external apparatus;
   a redundancy cell area including memory cells configured to substitute for failed memory cells; and
   a flag cell area including memory cells for storing an indication of whether most significant bits of the memory cells have been programmed,
   wherein the flag cell area is configured in a part of the redundancy cell area.

2. The nonvolatile memory apparatus according to claim 1, further comprising:
   a content addressed memory unit configured to substantially manage the redundancy cell area and the flag cell area.

3. The nonvolatile memory apparatus according to claim 2, wherein the content addressed memory unit comprises:
   a flag CAM latch block configured to store address information about the flag cell area;
   a repair CAM latch block configured to store address information about the redundancy cell area; and
   a CAM control logic configured to selectively control the flag CAM latch block and the repair CAM latch block in response to a flag activation signal and a repair activation signal.

4. The nonvolatile memory apparatus according to claim 3, wherein the CAM control logic is configured to provide the flag CAM latch block with a first address for selecting the flag cell area in response to the flag activation signal, and
   the flag CAM latch block is configured to output a physical address of the redundancy cell area corresponding to the first address.

5. The nonvolatile memory apparatus according to claim 4, wherein the CAM control logic is configured to provide the flag CAM latch block with one or more of first addresses.

6. The nonvolatile memory apparatus according to claim 3, wherein the CAM control logic is configured to provide the repair CAM latch block with a second address for selecting the redundancy cell area in response to the repair activation signal, and
   the repair CAM latch block is configured to output a physical address of the redundancy cell area corresponding to the second address.

7. The nonvolatile memory apparatus according to claim 3, further comprising:
   an address MUX configured to provide an address decoder with an address provided from the flag CAM latch block or the repair CAM latch block under, control of the CAM control logic.

8. The nonvolatile memory apparatus according to claim 7, further comprising:
   an address latch block configured to buffer the address provided from the flag CAM latch block or the repair CAM latch block, and provide the address MUX with the buffered address.

9. The nonvolatile memory apparatus according to claim 1, wherein the redundancy cell area is set as a remaining area after the flag cell area is set.

10. The nonvolatile memory apparatus according to claim 1, wherein each memory cell is configured to store 2-bit data, or 2-bit or more data.

* * * * *